(12) United States Patent
Hiroshima

(10) Patent No.: US 8,124,303 B2
(45) Date of Patent: Feb. 28, 2012

(54) PHASE SHIFT MASK AND METHOD FOR MANUFACTURING THE SAME, AND METHOD FOR MANUFACTURING INTEGRATED CIRCUIT

(75) Inventor: Masahito Hiroshima, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 76 days.

(21) Appl. No.: 12/639,504

(22) Filed: Dec. 16, 2009

(65) Prior Publication Data
US 2010/0159369 A1   Jun. 24, 2010

(30) Foreign Application Priority Data

Dec. 19, 2008   (JP) .................................. 2008-323727

(51) Int. Cl.
*G03F 1/00* (2006.01)
*G03F 1/14* (2006.01)
(52) U.S. Cl. ............................................................ 430/5
(58) Field of Classification Search .................. 430/5
See application file for complete search history.

(56) References Cited

U.S. PATENT DOCUMENTS
6,593,039 B1 *   7/2003   Kim .................... 430/5

FOREIGN PATENT DOCUMENTS

| JP | 11-143048 A | 5/1999 |
|---|---|---|
| JP | 2003-057422 A | 2/2003 |
| JP | 2005-129805 A | 5/2005 |
| JP | 2005-321641 A | 11/2005 |
| JP | 2006-084534 A | 3/2006 |
| JP | 2007-298546 A | 11/2007 |

OTHER PUBLICATIONS

Watanabe JP-2005-321641 (published Nov. 17, 2005, JPO machine translation).*
Hosono et al. JP-2003-057422 (published Feb. 26, 2003, JPO machine translation).*

* cited by examiner

*Primary Examiner* — Mark F Huff
*Assistant Examiner* — John S Ruggles
(74) *Attorney, Agent, or Firm* — Sughrue Mion, PLLC

(57) ABSTRACT

A phase shift mask is provided which includes: a substrate that is transparent to irradiation light, a shielding region formed on the substrate and in which a line pattern is formed, and a first transparent region and a second transparent region located on respective opposite sides of the shielding region on the substrate, wherein a phase shifter is formed under the first transparent region, and the phase shifter has a side wall including an outward protruding bent portion. The phase shifter can be formed by, for example, irradiating and scanning a predetermined region of the substrate with femtosecond pulse laser light applied from above the substrate.

8 Claims, 12 Drawing Sheets

PHASE SHIFT MASK AND METHOD FOR MANUFACTURING THE SAME, AND METHOD FOR MANUFACTURING INTEGRATED CIRCUIT

This application is based upon and claims the benefit of priority from Japanese patent application No. 2008-323727, filed on Dec. 19, 2008, the disclosure of which is incorporated herein in its entirety by reference.

BACKGROUND OF THE INVENTION

1. Field of the Invention

An exemplary aspect of the invention relates to a phase shift mask and a method for manufacturing the same, and a method for manufacturing an integrated circuit.

2. Description of the Related Art

For devices typified by semiconductor integrated circuits (hereinafter referred to as LSIs), particularly memory devices such as DRAMs, in which high-density transistors are arranged, the size of transistors has been reduced in recent years at an accelerated rate in order to increase the integration degree of the devices. For semiconductor process techniques, it is important to improve the transfer fidelity of a lithography technique to transfer an LSI pattern drawn on a photo mask onto a wafer in order to form the LSI pattern on a multilayer film stacked on the wafer.

The resolution R of an exposure apparatus, indicating the transfer fidelity of the lithography technique, is defined as $R = k1 \times \lambda / NA$, using three parameters, the exposure wavelength $\lambda$ of the exposure apparatus, the numerical aperture NA of the projection lens, and the process constant k1. In general, in order to reduce the resolution R, it is desirable to reduce the exposure wavelength $\lambda$ or to increase the numerical aperture NA of the projection lens. However, in any case, the exposure apparatus needs to be drastically modified. Obtaining an exposure apparatus with a higher resolution is not easy. Thus, techniques are available which improve the resolution by reducing only the process constant k1 of the exposure apparatus with $\lambda$ and NA unchanged. The techniques are commonly called super-resolution techniques.

A phase shift mask technique, which is one of the super-resolution techniques, in which the phase of a portion of light passing through a photo mask which is transmitted through a particular pattern is shifted by 180° from the phase of a portion of the light which is transmitted through another pattern, can sharply increase the separative resolution between the two patterns to be sharply increased. The phase shift mask technique is known to be capable of reducing k1 more sharply than any other super-resolution techniques. Specifically, openings and phase shifters are alternately formed in a mask so that each opening is sandwiched between the phase shifters and each of the phase shifters allows the phase of light transmitted through the adjacent opening to be inverted. The common phase shifter is of an engraved type formed by engraving the phase shifter on the substrate. The engraved phase shifter has a thickness of $\lambda/(2(n-1))$ in an engraved portion wherein $\lambda$ is the wavelength of irradiation light; the engraved phase shifter utilizes the property of light that while light is passing through a medium with a refractive index (n, where n>1), the wavelength of the light is 1/n of that of the light transmitted through the air, thereby providing a light path difference. Characteristically, the light intensity is equal to the square of a phase difference, and the separative resolution of light is highest at a phase inversion boundary portion.

However, in the corners of the bottom of the engraved phase shifter, transmitted light tends to be refracted and scattered outward. Thus, in the region where the phase shifter is formed, only the transmitted light except for scattered components contributes to the resolution of the pattern. That is, as shown in FIGS. 42 and 43 in Japanese Patent Application Laid-Open No. 2005-129805, the intensity of light transmitted through the region in which the phase shifter is formed is lower than that of light transmitted through the region in which the phase shifter is not formed. The imbalance of the light intensity may result in a dimensional difference in transfer patterns.

As a method for eliminating the imbalance of the light intensity, the following have been proposed:

(1) a method in which a shielding film extends like an eave at each opening in a phase shifter (see FIGS. 45 and 46 in Japanese Patent Application Laid-Open No. 2005-129805);

(2) a method of stacking two types of masks such that regions in which the phase shifter is formed in one mask are identical to regions in which the phase shifter is not formed in the other mask and regions in which the phase shifter is not formed in one mask are identical to regions in which the phase shifter is formed in the other mask (see FIGS. 1 to 3 in Japanese Patent Application Laid-Open No. 2005-129805);

(3) a method of increasing the width of each opening in a phase shifter to compensate for the light intensity corresponding to scattered components (see FIG. 7 in Japanese Patent Application Laid-Open No. 2007-298546);

(4) a method of increasing the width of each opening in a phase shifter and setting an inclination angle $\alpha$ for side walls of the phase shifter (see FIG. 1 in Japanese Patent Application Laid-Open No. 2007-298546); and (5) a method of forming a projecting portion in which a shielding film projects at each opening in a phase shifter and forming, on a substrate, a support portion configured to support the projecting portion (see FIGS. 1 and 2 in Japanese Patent Application Laid-Open No. 2005-321641).

An exemplary aspect of the invention provides a phase shift mask with a new structure.

SUMMARY OF THE INVENTION

An exemplary aspect of the invention provides a phase shift mask comprising: a substrate that is transparent to irradiation light, a shielding region formed on the substrate and in which a line pattern is formed, and a first transparent region and a second transparent region located on respective opposite sides of the shielding region on the substrate, wherein a phase shifter is formed under the first transparent region, and the phase shifter has a side wall including an outward protruding bent portion.

An exemplary aspect of the invention provides a method for manufacturing a phase shift mask, comprising: forming a shielding region with a line pattern on a substrate that is transparent to irradiation light, and irradiating and scanning a first transparent region located on one side of the shielding region with femtosecond pulse laser light applied from above the substrate, to form a phase shifter which has a side wall including an outward protruding bent portion.

An exemplary aspect of the invention provides a method for manufacturing an integrated circuit, comprising using a phase shift mask according to an above-described exemplary embodiment to transfer the line pattern formed on the phase shift mask.

An exemplary aspect of the invention can provide a phase shift mask with a new structure.

BRIEF DESCRIPTION OF THE DRAWINGS

FIGS. 3a to 3c are diagrams showing the diffracted image of transmitted light obtained when the phase shift mask according to a first exemplary embodiment is used, wherein FIG. 3a shows the phase difference before synthesis, FIG. 3b shows the phase difference after synthesis, and FIG. 3c shows the light intensity;

DETAILED DESCRIPTION OF THE PREFERRED EMBODIMENTS

First Exemplary Embodiment

Figure 1:
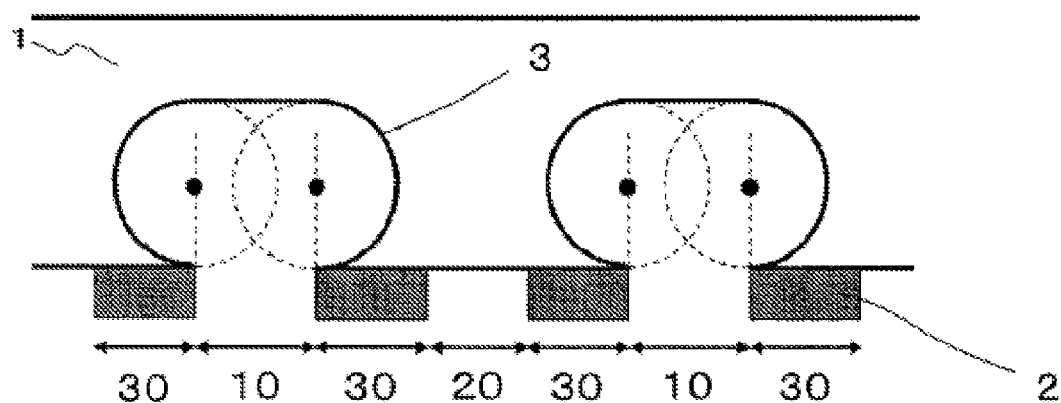
FIG. 1 is a diagram showing the sectional structure of the phase shift mask according to a first exemplary embodiment.

FIG. 1 shows the sectional structure of phase shift mask as viewed in a direction perpendicular to a line and space pattern according to an exemplary embodiment.

The phase shift mask includes a shielding region 30, in which a line pattern is formed, on a substrate 1 that is transparent to irradiation light. The shielding region 30 corresponds to a line portion of a line and space pattern which is formed on the phase shift mask. The substrate 1 is transparent to irradiation light and is made of, for example, glass. In the shielding region 30 on substrate 1, a shielding conductive film 2 is formed of, for example, chromium on the surface of the substrate 1. One shielding region 30 corresponding to a single line pattern may be formed on the substrate 1. However, alternatively, plurality of shielding regions 30 corresponding to a plurality of parallel line patterns may be formed on the substrate 1.

A first transparent region 10 and a second transparent region 20 are arranged on the respective opposite sides of the shielding region 30. If plurality of shielding regions 30 corresponding to a plurality of parallel line patterns are formed, the first transparent region 10 and the second transparent region 20 are each alternately arranged between the shielding regions.

A trench is formed under the respective first transparent region 10 as a phase shifter 3 by engaging the trench on the surface of the substrate 1. In the cross section in FIG. 1, the side walls of the phase shifter 3 are shaped like outward protruding semicircles. When the phase shifter including the side walls with the outward protruding bent portions is formed as in an exemplary embodiment, a possible decrease in the intensity of transmitted light can be effectively inhibited. The phase shifter can thus be generally applied regardless of the size of the mask pattern. In the cross section in FIG. 1, each of the side walls of the phase shifter 3 as a whole forms semicircle. However, the side wall of the phase shifter may only include an outward protruding bent portion. For example, the side walls may be composed of circular arcs and straight lines.

The depth of the trench, corresponding to the phase shifter 3, may be appropriately determined such that the phase can be shifted by a predetermined amount. For example, to allow the phase of light transmitted through the first transparent region to be shifted by 180° to set the difference in phase between the light transmitted through the first transparent region and the light transmitted through the second transparent region to 180°, the depth of the trench may be set to $\lambda/(2(n-1))$ wherein $\lambda$ is the wavelength of irradiation light and n is the refractive index of the substrate. If the side wall of the phase shifter 3 as a whole forms a semicircle, then in the cross section in FIG. 1, the radius of the semicircle formed on the side wall of the phase shifter 3 may be set to $\lambda/(4(n-1))$.

Figure 2:
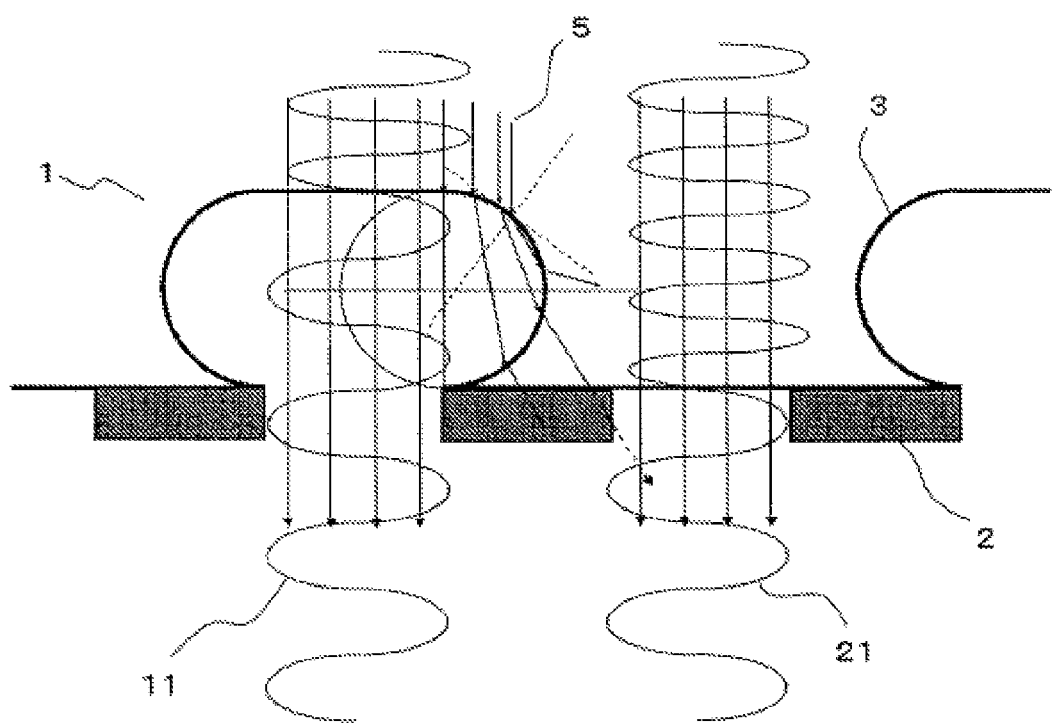
FIG. 2 is a diagram showing an image of wavelength of light transmitted through the phase shift mask according to a first exemplary embodiment.

FIG. 2 shows an image of waveform of light transmitted through the phase shift mask. In the first transparent region 10, as shown by image 11 of waveform of light transmitted through the first transparent region, irradiation light 5 has a wavelength $\lambda/n$ until the light reaches the portion of the substrate 1 in which the phase shifter 3 is formed and a wavelength $\lambda$ while the light is further traveling after reaching the portion in which the phase shifter 3 is formed because the atmosphere is present in and beyond this portion. In contrast, in the second transparent region 20, as shown by image 21 of waveform of light transmitted through the second transparent region, irradiation light 5 has the wavelength $\lambda/n$ until the light reaches the surface of the substrate 1 and the wavelength $\lambda$ while the light is further traveling after reaching the surface of the substrate 1. If the depth of the trench in the phase shifter is $\lambda/(2(n-1))$, the phase of the light transmitted through the first transparent region is shifted by 180° from the phase of the light transmitted through the second transparent region.

Figure 3A:
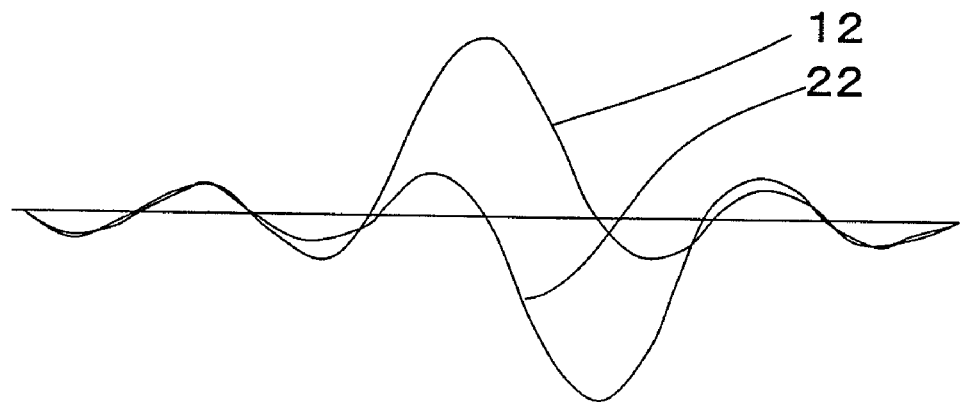
Figure 3B:
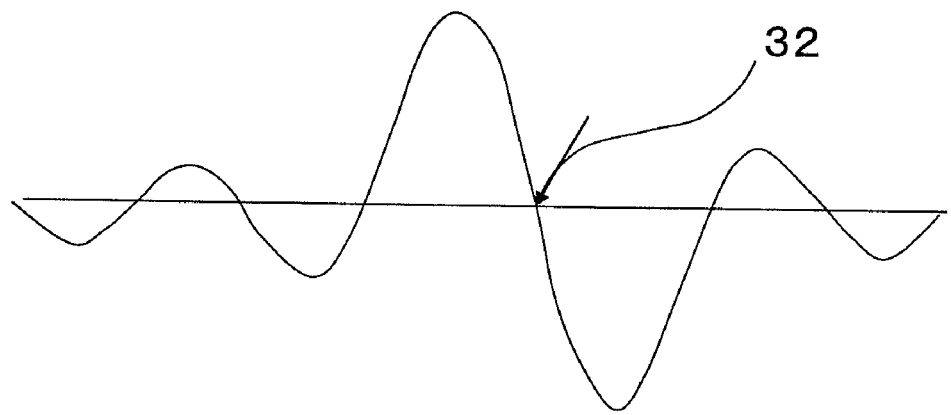
Figure 3C:
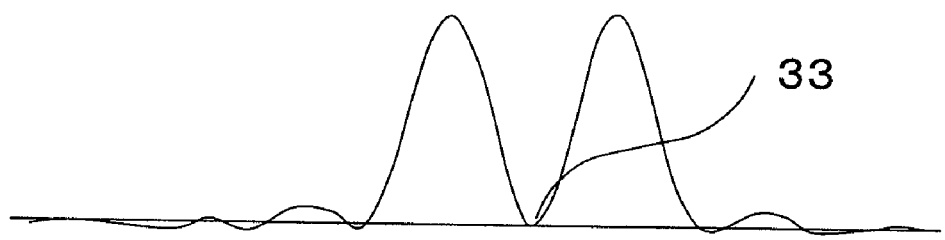

FIGS. 3a to 3c show diffracted images of the transmitted light at the time. FIG. 3a shows phase difference images 12 and 22 of the light transmitted through the first transparent region and the second transparent region, respectively. FIG. 3b shows phase a difference image 32 obtained by synthesizing the above-described two types of light. As described above, the light intensity is equal to the square of the phase difference. Thus, the light intensity (that is, separative resolution) is highest at a phase inversion boundary portion 33.

Since the side walls (substrate-atmosphere interfaces) of the phase shifter are formed as gently convex lenses with a radius $\lambda/(4(n-1))$, light entering the interior (atmosphere) of the phase shifter 3 through the interior of the substrate 1 is refracted outward from the optical axis at the protruding surface portion. Then, upon entering the recessed surface portion at the boundary between the phase shifter and the substrate 1 through the phase shifter, the light is refracted toward the back surface of the shielding conductive film and terminated. Thus, the secondary interference of off-axis refracted light is prevented from significantly affecting the image formation characteristics of the light transmitted through the first transparent region and the light transmitted through the second transparent region.

Figure 7:
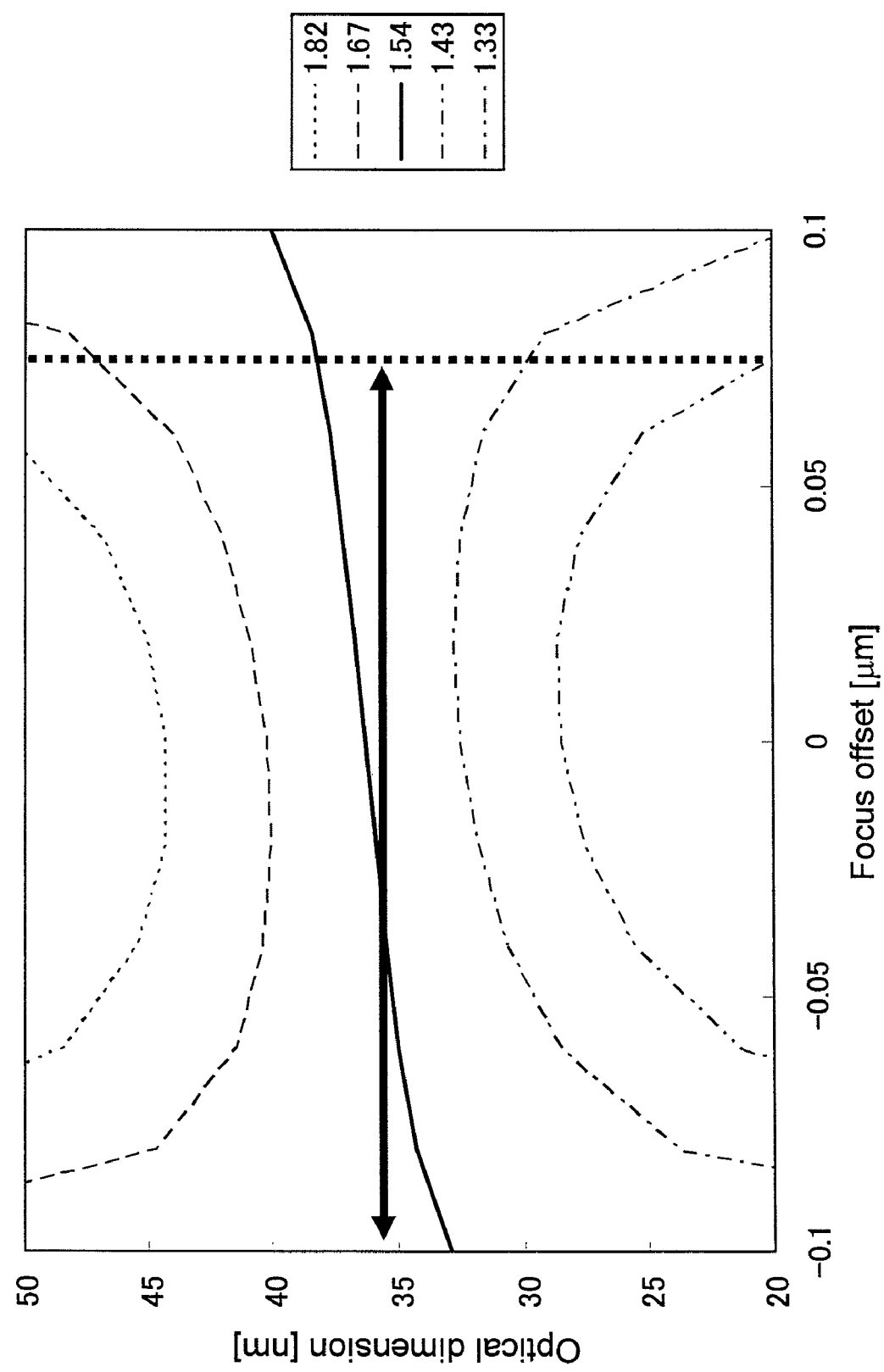
FIG. 7 is a diagram showing the results of the optical dimension, which is obtained by wafer transfer process margin simulation for the second transparent region of the phase shift mask according to a first exemplary embodiment.

In particular, in the structure shown in FIG. 7 of Japanese Patent Application Laid-Open No. 2007-298546, increasing miniaturization of the pattern more significantly reduces the intensity of transmitted light as a result of the waveguide effect of the phase shifter section. Thus, optical images are degraded. With a photo mask having a pattern with a wafer scale half pitch of 36 nm, obtaining even the minimum optical contrast required for resolution in the phase shifter section is difficult. In contrast, an exemplary embodiment can minimize a decrease in the intensity of transmitted light resulting from the waveguide effect in the phase shifter section. This allows a sufficient optical contrast for resolution to be obtained.

In the cross section in FIG. 1, the center of each of the semicircles formed on the side walls of the phase shifter 3 is positioned at the interface between the first transparent region 10 and the shielding region 30 as viewed from the top surface of the substrate 1. Thus, the projection length of a portion of the phase shifter 3 projecting like an eave at the shielding region 30 can be set to $\lambda/(4(n-1))$, corresponding to the radius of the semicircle. On the other hand, the portion projecting like an eave has a two-layer structure of the shielding conductive film and the substrate. This prevents a possible decrease in mechanical strength.

In particular, in the structure shown in FIGS. 45 and 46 of Japanese Patent Application Laid-Open No. 2005-129805, the shift amount (the length of the portion projecting like an eave at the shielding region) of the side wall of the engraved portion of the phase shifter, which is required to almost completely inhibit a possible decrease in light intensity resulting from scattered components, is a mask scale of at least about 150 nm for a KrF excimer laser with a wavelength of 248 nm and a mask scale of at least about 80 nm for an ArF excimer laser with a wavelength of 193 nm. On the other hand, if exposure with an ArF excimer laser is used to transfer patterns with an on-wafer half pitch of 65 nm, 45 nm, and 36 nm, the shielding conductive film on the mask has a width of 260 nm, 180 nm, and 144 nm, respectively, and the ratio of the length of the portion projecting like an eave in the width of the shielding conducive film is increased such as 38%, 56%, and 69%, respectively. It is commonly known that if the ratio of the length of the portion projecting like an eave in the width of the shielding conducive film exceeds 50%, the shielding conductive film may be damaged during a manufacturing process stage. Consequently, for phase shift masks with a half pitch of at most 45 nm, corresponding to a ratio of higher than 50%, the structure shown in FIGS. 45 and 46 of Japanese Patent Application Laid-Open No. 2005-129805 is not applicable.

In contrast, in an exemplary embodiment, in the portion projecting like an eave has the two-layer structure of the shielding conductive film and the substrate, preventing a possible decrease in mechanical strength. This in turn prevents a possible problem such as damage to the structure even with a reduction in the pattern size of the shielding conductive film. That is, the phase shift mask according to an exemplary embodiment is applicable, in ArF excimer laser exposure, to a fine pattern region with a wafer scale half pitch of even at most 45 nm.

FIGS. 4a to 4d show the sectional structures of a phase shift mask in each steps of one method for manufacturing a phase shift mask according to an exemplary embodiment.

Figure 4A:
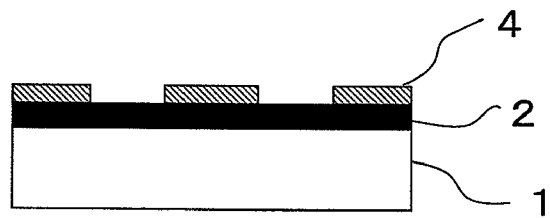
FIGS. 4a to 4d are diagrams showing the sectional structure of a phase shift mask in each steps of one method for manufacturing a phase shift mask according to a first exemplary embodiment.
Figure 4B:

First, a shielding region 30 with a line pattern is formed on a substrate 1 that is transparent to irradiation light. For example, a shielding conductive film 2 and an organic photo sensitive film 4 are first formed on the substrate 1 and a line pattern is then formed on the organic photo sensitive film 4 by drawing with electron beam (FIG. 4a). Then, the shielding conductive film 2 is etched through the organic photo sensitive film 4 as a mask, and the organic photo sensitive film 4 is then removed. Thus, the shielding region 30 with the line pattern can be formed (FIG. 4b).

Figure 4C:
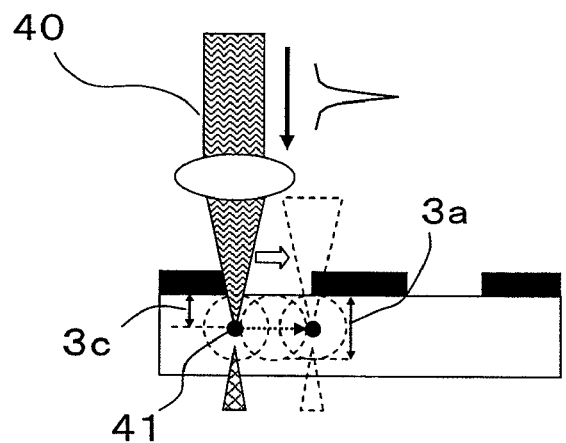
Figure 4D:
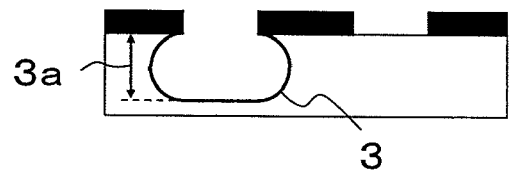

Then, a first transparent region 10 located on one side of the shielding region 30 is irradiated and scanned with femtosecond pulse laser light 40 from above the substrate 1 (FIG. 4c). At this time, with the focal depth of femtosecond pulse laser light 40 maintained, femtosecond pulse laser light 40 is moved for scanning to make the side walls of the phase shifter 3 in a cross section perpendicular to the line pattern semicircular. Thus, the phase shifter 3 can be formed so as to include side walls with outward protruding bent portions (FIG. 4d). For example, focus 41 of femtosecond pulse laser light 40 is set at the position of a depth of $\lambda/(4(n-1))$ from the surface of the substrate 1. With focus 41 maintained, irradiation conditions for femtosecond pulse laser light 40 can be adjusted so as to set a depth 3a of a trench to be formed to $\lambda/(2(n-1))$.

The boundary between the first transparent region 10 and the shielding region 30 as viewed from the top surface of the substrate 1 may be used as the contour of a scan region for femtosecond pulse laser light 40. Then, in the cross section in FIGS. 4a to 4d, the center of the semicircle formed on the side wall of the phase shifter 3 is positioned at the interface between the first transparent region 10 and the shielding region 30 as viewed from the top surface of the substrate 1.

Second Exemplary Embodiment

Figure 10:
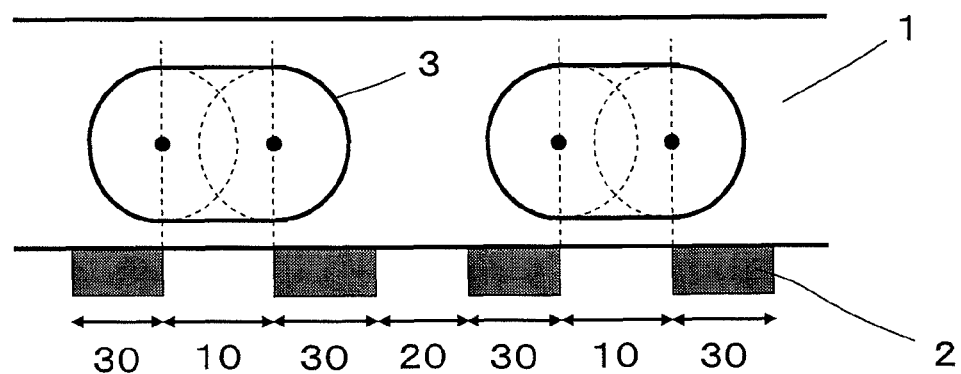
FIG. 10 is a diagram showing the sectional structure of the phase shift mask according to a second exemplary embodiment.

FIG. 10 shows the sectional structure of a phase shift mask according to an exemplary embodiment. Only differences from a first exemplary embodiment will be described below.

In the phase shift mask shown in FIG. 10, a cavity is formed inside a substrate 1 below a first transparent region 10 as a phase shifter 3. In the cross section in FIG. 10, the side walls of the phase shifter 3 form outward protruding semicircles. When the phase shifter includes the side walls with the outward protruding bent portions, a possible decrease in the intensity of transmitted light can be effectively inhibited. The phase shifter is thus generally applicable regardless of the mask pattern size. Furthermore, the portion projecting like an eave at a shielding region 30 is always reinforced by the substrate 1 remaining on the surface portion of the phase shift mask. In the cross section in FIG. 10, the side wall of the phase shifter 3 as a whole forms a semicircle. However, the side wall may only include an outward protruding bent portion. For example, the side wall may be composed of circular arcs and straight lines.

The height of the cavity, corresponding to the phase shifter 3, may be appropriately determined such that the phase can be shifted by a predetermined amount. For example, to allow the phase of light transmitted through the first transparent region to be shifted by 180° to set the difference in phase between the light transmitted through the first transparent region and the light transmitted through the second transparent region to 180°, the height of the cavity may be set to $\lambda/(2(n-1))$ wherein $\lambda$ is the wavelength of irradiation light and n is the refractive index of the substrate. If the side wall of the phase shifter 3 as a whole forms a semicircle, then in the cross section in FIG. 10, the radius of the semicircle formed on the side wall of the phase shifter 3 may be set to $\lambda/(4(n-1))$.

Figure 11:
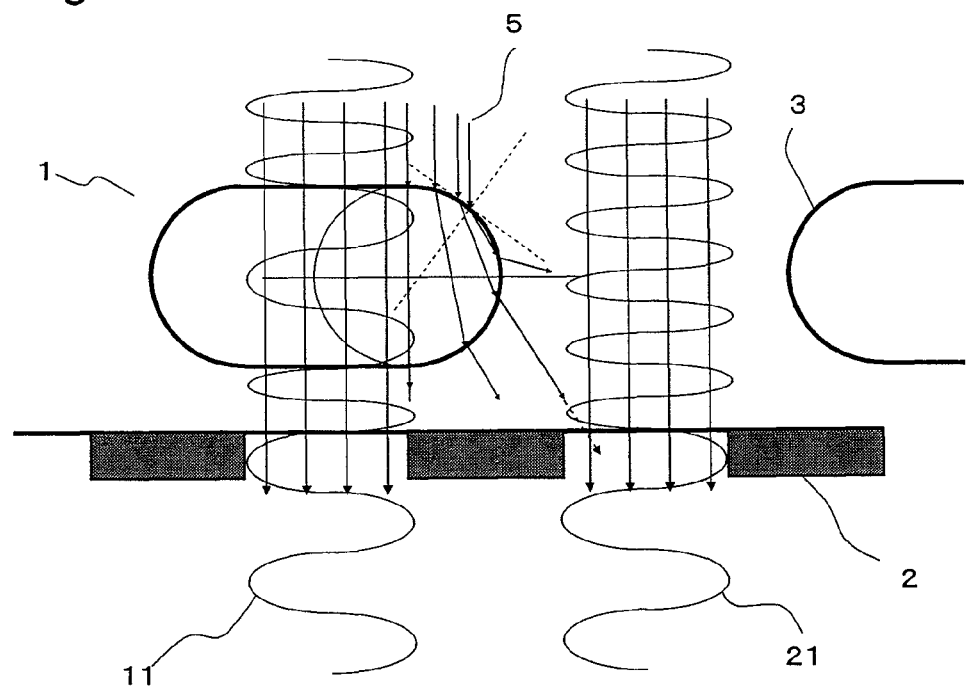
FIG. 11 is a diagram showing the image of wavelength of light transmitted through the phase shift mask according to a second exemplary embodiment.

FIG. 11 shows an image of the waveform of light transmitted through the phase shift mask. In a first transparent region 10, as shown by an image 11 of waveform of light transmitted through the first transparent region, irradiation light 5 has a wavelength $\lambda/n$ until the light reaches the portion of the substrate 1 in which the phase shifter 3 is formed and a wavelength $\lambda$ while the light is further traveling after reaching the portion in which the phase shifter 3 is formed because the atmosphere is present in and beyond this portion. Thereafter, the light enters the substrate 1 again, and has the wavelength $\lambda/n$ inside the substrate 1 and the wavelength $\lambda$ in and beyond the surface of the substrate 1. In contrast, in a second transparent region 20, as shown by an image 21 of waveform of light transmitted through the second transparent region, irradiation light 5 has the wavelength $\lambda/n$ until the light reaches the surface of the substrate 1 and the wavelength $\lambda$ while the light is further traveling after reaching the surface of the substrate 1. If the depth of the cavity in the phase shifter is $\lambda/(2(n-1))$, the phase of the light transmitted through the first transparent region is shifted by 180° from the phase of the light transmitted through the second transparent region.

FIGS. 12a to 12d show the sectional structures of a phase shift mask in each steps of one method for manufacturing a phase shift mask according to an exemplary embodiment.

Figure 12A:
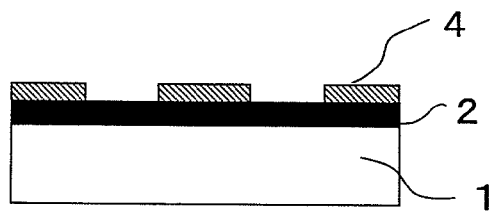
FIGS. 12a to 12d are diagrams showing the sectional structure of a phase shift mask in each steps of one method for manufacturing a phase shift mask according to a second exemplary embodiment.
Figure 12B:
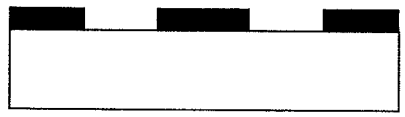

First, a shielding region 30 with a line pattern is formed on a substrate 1 that is transparent to irradiation light. For example, a shielding conductive film 2 and an organic photo sensitive film 4 are first formed on the substrate 1 and a line pattern is then formed on the organic photo sensitive film 4 by drawing with electron beam (FIG. 12a). Then, the shielding conductive film 2 is etched through the organic photo sensitive film 4 as a mask, and the organic photo sensitive film 4 is then removed. Thus, the shielding region 30 with the line pattern can be formed (FIG. 12b).

Figure 12C:
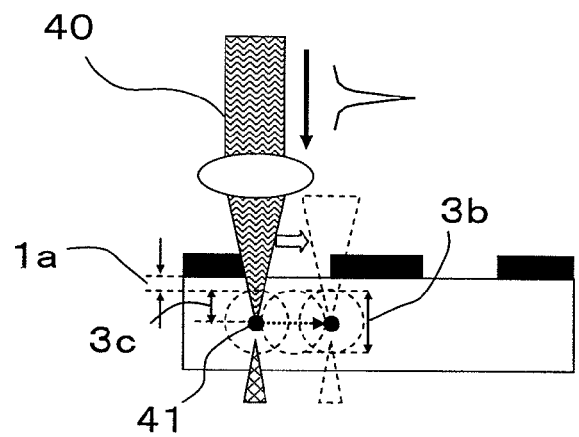
Figure 12D:
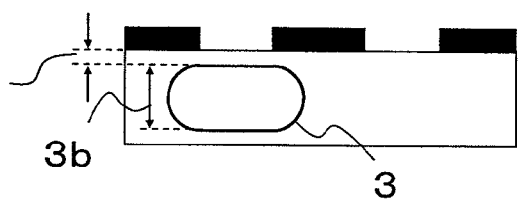

Then, a first transparent region 10 located on one side of the shielding region 30 is irradiated and scanned with femtosecond pulse laser light 40 from above the substrate 1 (FIG. 12c). At this time, with the focal depth of femtosecond pulse laser light 40 maintained, femtosecond pulse laser light 40 is moved for scanning to make the side walls of the phase shifter 3 in a cross section perpendicular to the line pattern semicircular. Thus, the phase shifter 3 can be formed so as to include side walls with outward protruding bent portions (FIG. 12d). For example, focus 41 of femtosecond pulse laser light 40 is set at the position of a depth of $\lambda/(4(n-1))+\Delta d$ from the surface of the substrate 1 wherein $\Delta d$ is a distance 1a from the substrate surface to the cavity. With focus 41 maintained, irradiation conditions for femtosecond pulse laser light 40 can be adjusted so as to set a height 3b of a cavity to be formed to $\lambda/(2(n-1))$.

FIGS. 13a to 13e show the sectional structures of a phase shift mask in each steps of another method for manufacturing a phase shift mask according to an exemplary embodiment.

Figure 13A:
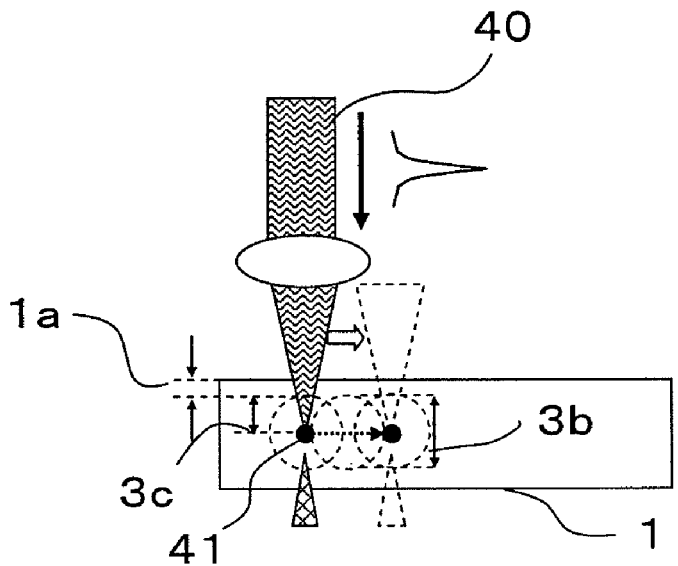
FIGS. 13a to 13e are diagrams showing the sectional structure of a phase shift mask in each steps of one method for manufacturing a phase shift mask according to a second exemplary embodiment.
Figure 13B:
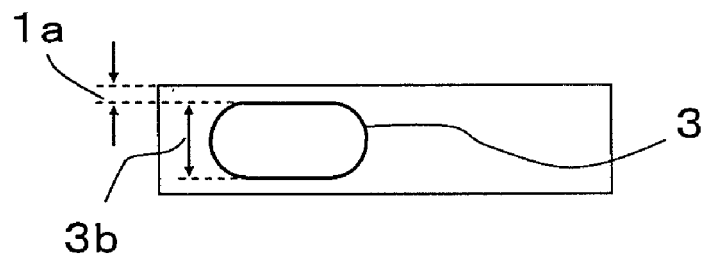
Figure 13C:
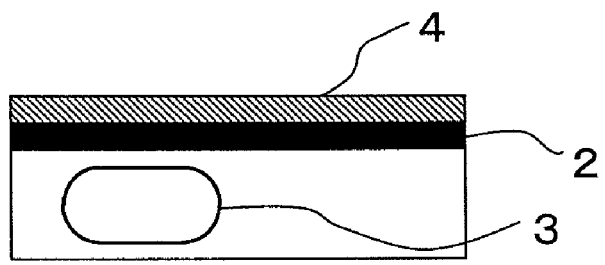

First, a substrate 1 is irradiated and scanned with femtosecond pulse laser light 40 from above the substrate 1 that is transparent to irradiation light (FIG. 13a). At this time, with the focal depth of femtosecond pulse laser light 40 maintained, femtosecond pulse laser light 40 is moved for scanning to make the side walls of the phase shifter 3 in a cross section perpendicular to the line pattern semicircular. Thus, the phase shifter 3 can be formed so as to include side walls with outward protruding bent portions (FIG. 13b). For example, focus 41 of femtosecond pulse laser light 40 is set at the position of a depth of $\lambda/(4(n-1))$ from the surface of the substrate 1. With focus 41 maintained, irradiation conditions for femtosecond pulse laser light 40 can be adjusted so as to set a height 3a of a trench to be formed to $\lambda/(2(n-1))$.

Figure 13D:
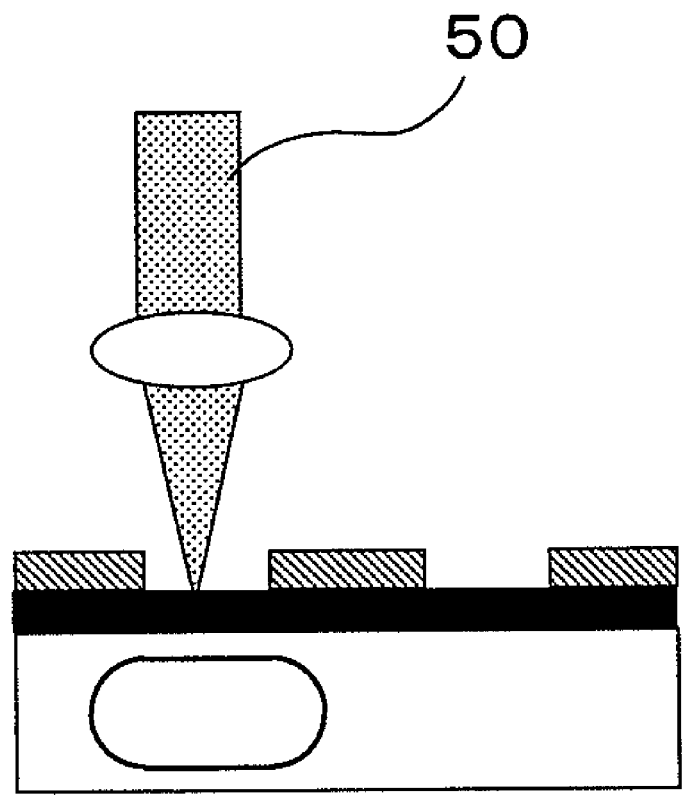
Figure 13E:

Then, a shielding region 30 with a light pattern is formed on substrate 1. For example, a shielding conductive film 2 and an organic photo sensitive film 4 are first formed on the substrate 1 (FIG. 13c), and a line pattern is then formed on the organic photo sensitive film 4 by drawing with electron beam 50 using already formed the phase shifter 3 as an alignment target (FIG. 13d). Then, the shielding conductive film 2 is etched through the organic photo sensitive film 4 as a mask, and the organic photo sensitive film 4 is then removed. As a result, the shielding region 30 can be formed (FIG. 13e).

Other Exemplary Embodiments

An integrated circuit can be manufactured by transferring a line pattern formed on the phase shift mask according to an exemplary embodiment.

Example (Implementation Method)

A femtosecond pulse laser processing apparatus is used to process a glass substrate to produce a phase shift mask according to a first exemplary embodiment.

First, only arrangement data on the phase shifter is extracted from design data. The contour portion of femtosecond pulse laser scan region is set to align with the outermost circumferential portion of the arrangement data on the phase shifter. The focus of femtosecond pulse laser light is set at the position of a depth of $\lambda/(4(n-1))$ from the surface of the substrate. Irradiation conditions for femtosecond pulse laser light include a pulse width of 200 to 400 fs, a repetition frequency of 100 kHz, and a pulse energy optimized using a center value of about 100 μJ. The optimization involves calibration such that a vacancy shaped like a perfect sphere (vacancy diameter=$\lambda/4(n-1)$) centered on the irradiation focus portion is formed within a peak density range in a Gaussian distribution which falls within an optical-absorption length region.

Thereafter, the entire inside of the femtosecond pulse laser scan region (phase shifter contour extraction region) is scanned with the focal depth maintained to form a phase shifter.

(Prediction Based on Simulation)

A phase shift mask according to a first exemplary embodiment including a line and space pattern with a wafer scale pitch of 72 nm (wafer scale half pitch of 36 nm) was virtually produced. The wafer transfer characteristics of the phase shift mask were predicted based on three-dimensional strict-electromagnetic-field simulation. Exposure simulation conditions are as follows:

light source wavelength: 193 nm (ArF);

refractive index of a projection lens final bottom surface lens (LuAG): n_lens=1.8;

refractive index of a liquid immersed medium (third-generation high-refraction liquid): n_liquid=1.8;

numerical aperture of a projecting optical system lens: NA=1.7 (effective NA=0.944);

illuminating optical aperture: σ=0.3 (small σ);

mask pattern aspect: line and space pattern with a pitch of 288 nm (on-wafer equivalent pitch: 72 nm); and mask three-dimensional strict-electromagnetic-field simulation.

Figure 5:
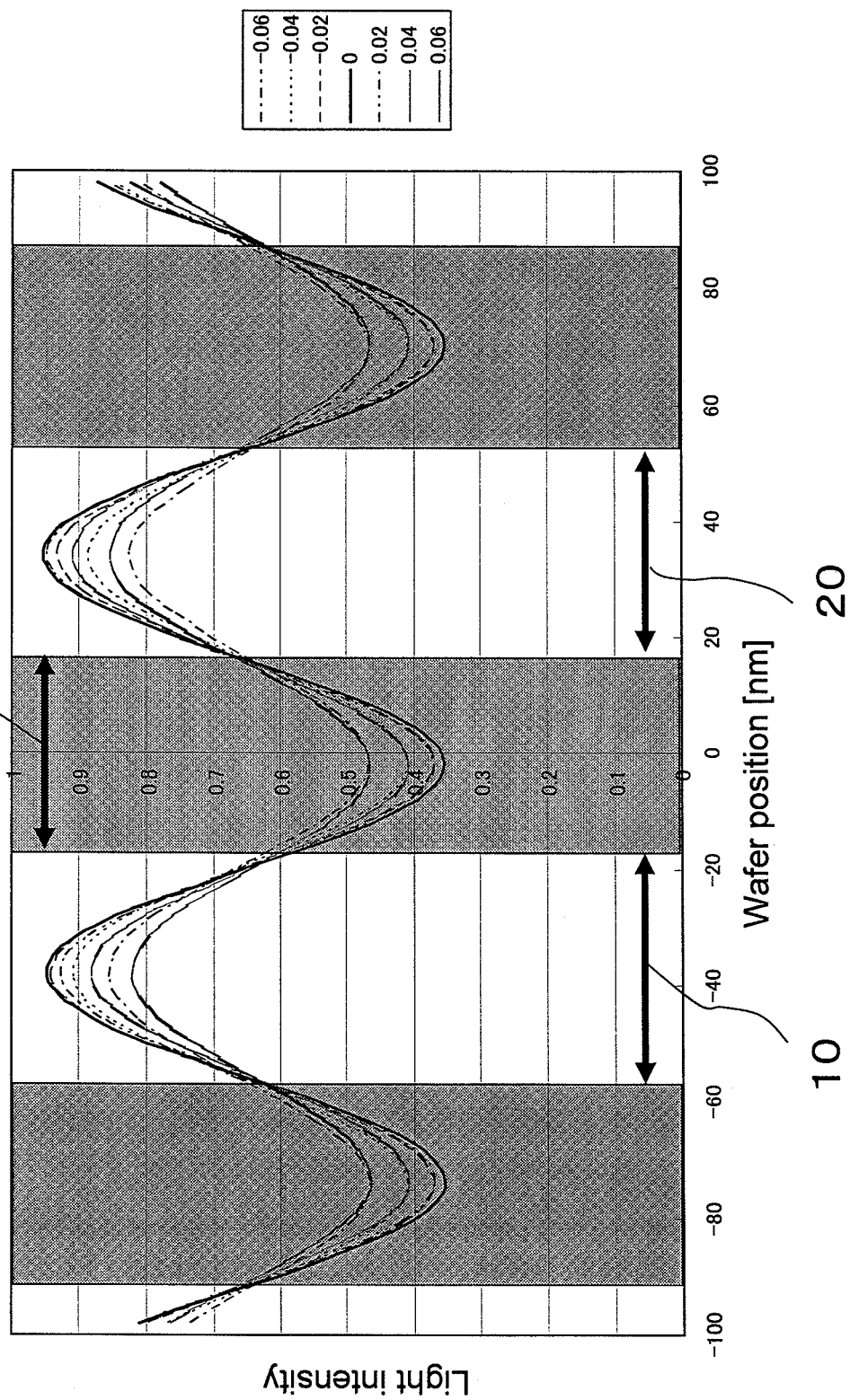
FIG. 5 is a diagram showing the results of wafer transfer image simulation of the phase shift mask according to a first exemplary embodiment.

As shown in FIG. 5, the results of wafer transfer image simulation (parameter: focus offset amount) indicated that both the first transparent region (phase shifter present portion) and the second transparent region (phase shifter absent portion) provided an equivalent light intensity and an equivalent optical contrast which is calculated by (maximum light intensity−minimum light intensity)/(maximum light intensity+minimum light intensity).

Figure 6:
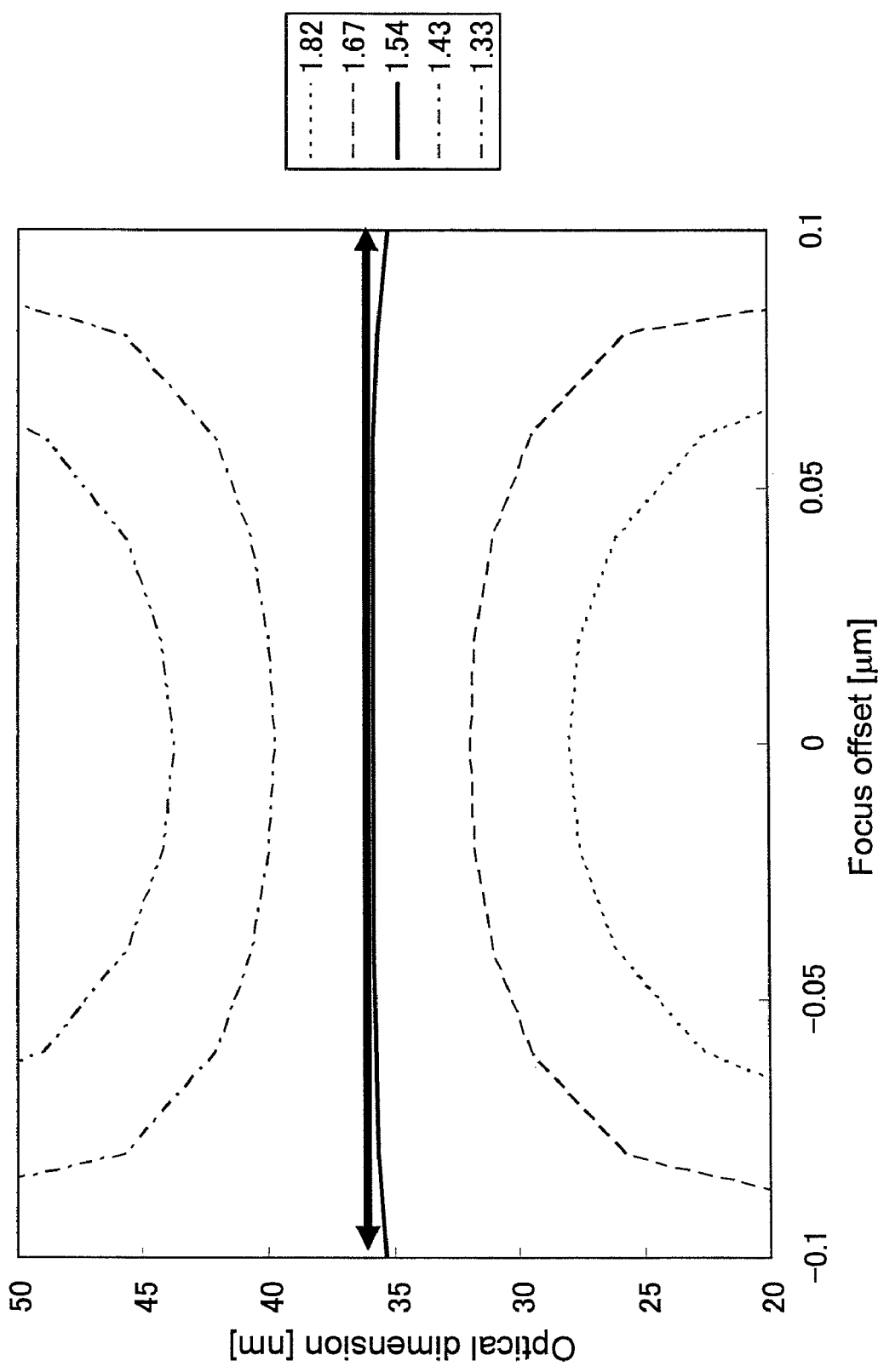
FIG. 6 is a diagram showing the results of the optical dimension, which is obtained by wafer transfer process margin simulation for the shielding region of the phase shift mask according to a first exemplary embodiment.
Figure 8:
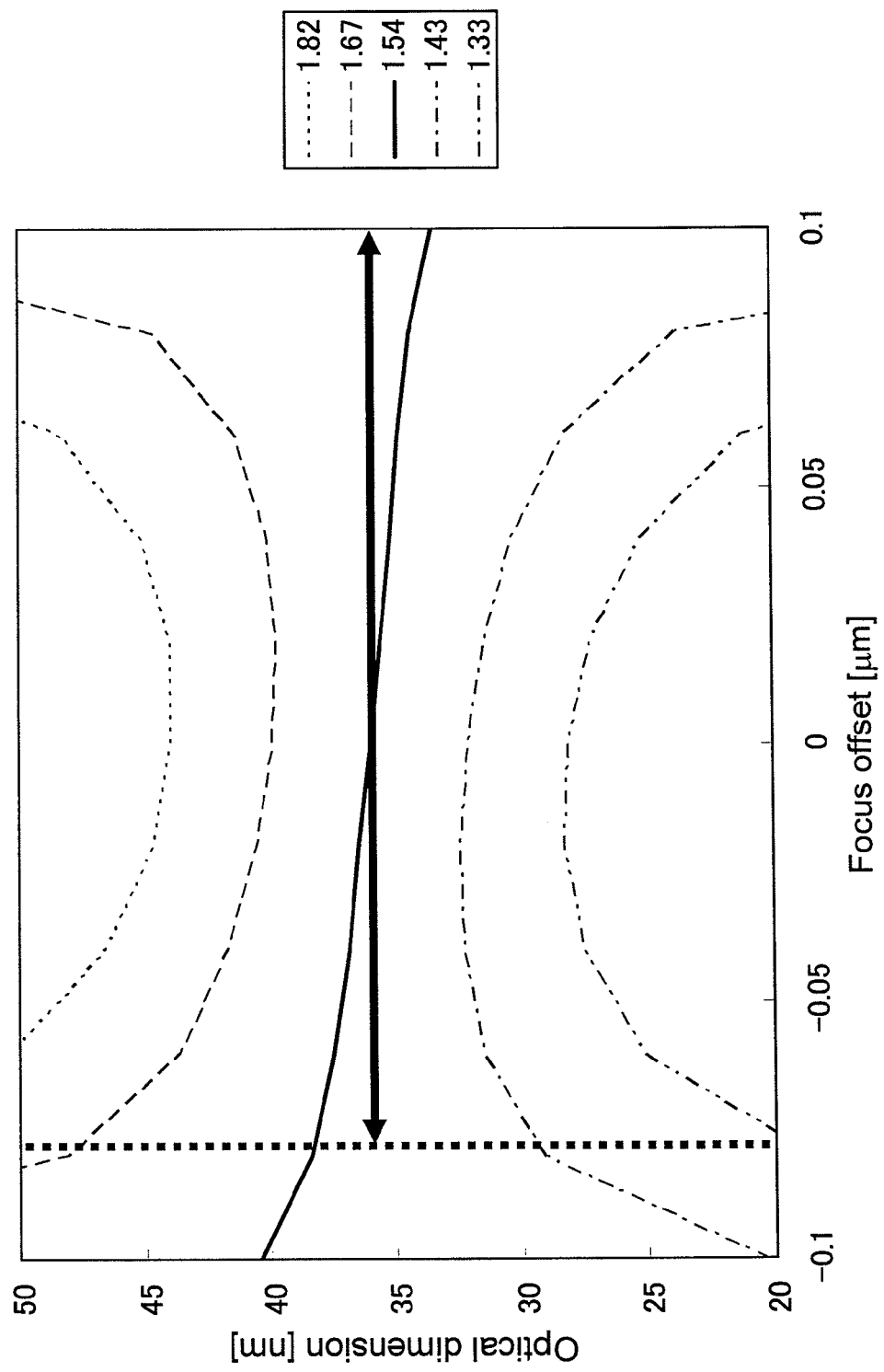
FIG. 8 is a diagram showing the results of the optical dimension, which is obtained by wafer transfer process margin simulation for the first transparent region of the phase shift mask according to a first exemplary embodiment.
Figure 9:
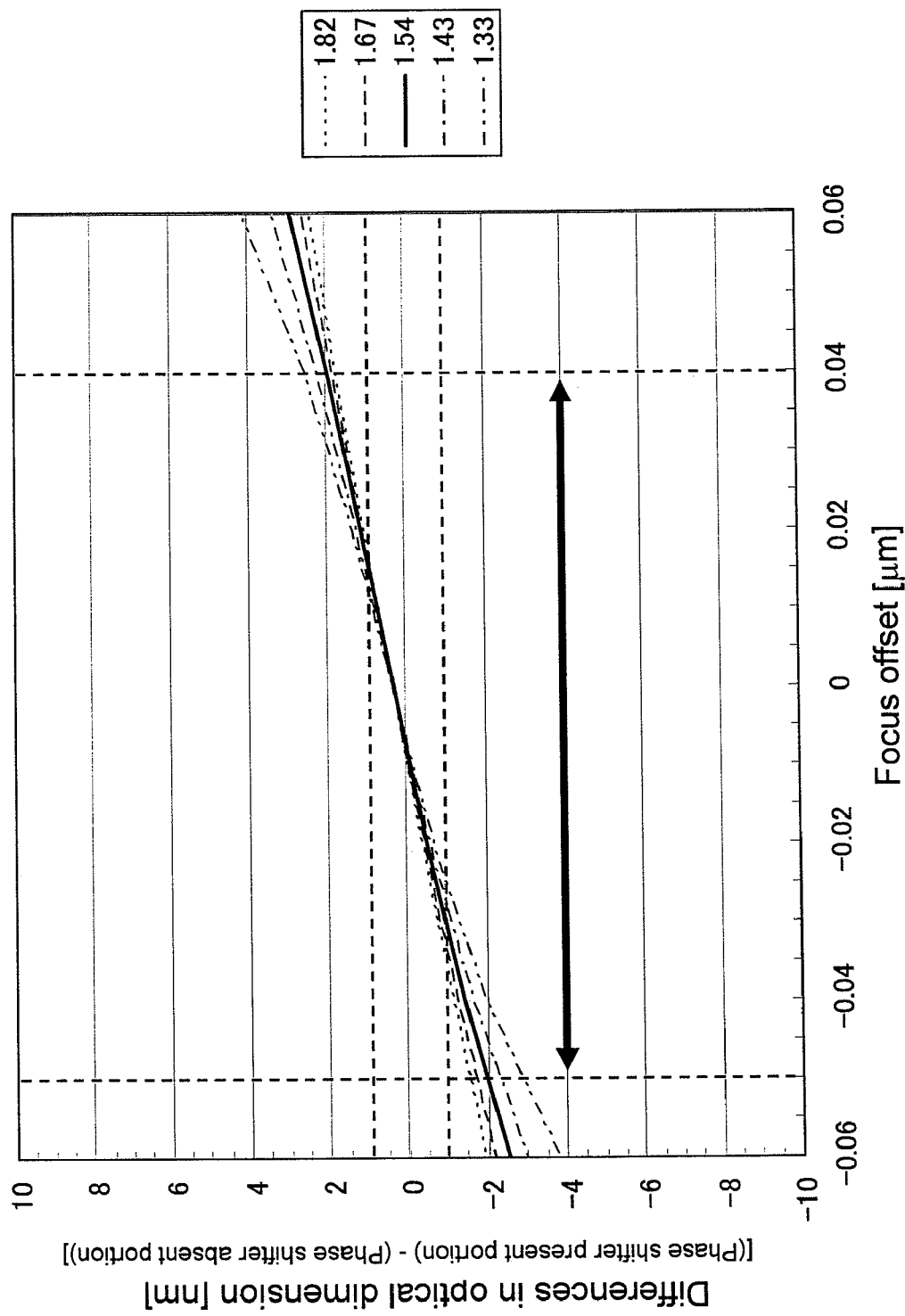
FIG. 9 is a diagram showing the results of the differences in the optical dimension, which is obtained by wafer transfer process margin simulation for the phase shift mask according to a first exemplary embodiment.

Moreover, the robustness of exposure characteristic against focus variation was verified through simulation (parameter: reciprocal of the light intensity). As the result, when an allowable range of ±10% was set for transfer dimensions, the depth of focus (hereinafter referred to as the DoF) of the shielding region (phase shifter presence-absence separating line portion) was 200 nm or more (FIG. 6), the DoF of the second transparent region (phase shifter absent portion) was 180 nm (FIG. 7), and the DoF of the first transparent region (phase shifter present portion) was 180 nm (FIG. 8). Moreover, when the allowable range was set to ±2 nm based on the assumption of a demand for LSI products, the resulting DoF was suggested to be about 90 nm (FIG. 9).

As described above, an exemplary embodiment enables construction of a lithography process for microprocessing for the next-next generation which exhibits high resolution performance and which is robust against a process variation.

While an exemplary aspect of the invention has been described based on the foregoing exemplary embodiments, a phase shift mask and a method for manufacturing the same, and a method for manufacturing an integrated circuit according to an exemplary aspect of the invention are not limited to the arrangements of the foregoing exemplary embodiments. Various modifications and changes from the arrangements of the foregoing exemplary embodiments are included in the scope of an exemplary aspect of the invention.

What is claimed is:

1. A phase shift mask comprising:
   a substrate that is transparent to irradiation light,
   a shielding region formed on the substrate and in which a line portion of a line and space pattern is formed, and
   a first transparent region and a second transparent region located on respective opposite sides of the shielding region on the substrate,
   wherein a phase shifter is formed under the first transparent region, and the phase shifter has a side wall including an outward protruding portion, and
   wherein the outward protruding portion of the side wall of the phase shifter forms a semicircle in a cross section of the phase shift mask taken along a direction perpendicular to the line and space pattern.

2. The phase shift mask according to claim 1, wherein the semicircle has a radius of $\lambda/(4(n-1))$ wherein $\lambda$ is a wavelength of irradiation light and n is a refractive index of the substrate.

3. The phase shift mask according to claim 2, wherein the semicircle has a center positioned at a boundary between the first transparent region and the shielding region as viewed from a top surface of the substrate.

4. The phase shift mask according to claim 1, wherein the phase shifter is a trench engraved on a surface of the substrate.

5. The phase shift mask according to claim 4, wherein the trench has a depth of $\lambda/(2(n-1))$ wherein $\lambda$ is a wavelength of irradiation light and n is a refractive index of the substrate.

6. The phase shift mask according to claim 1, wherein the phase shifter is a cavity formed inside the substrate.

7. The phase shift mask according to claim 6, wherein the cavity has a height of $\lambda/(2(n-1))$ wherein $\lambda$ is a wavelength of irradiation light and n is a refractive index of the substrate.

8. The phase shift mask according to claim 1, wherein a shielding conductive film is formed in the shielding region on the substrate.

* * * * *